(12) United States Patent
Mori

(10) Patent No.: US 7,126,757 B2
(45) Date of Patent: Oct. 24, 2006

(54) ILLUMINATION APPARATUS, EXPOSURE APPARATUS USING THE SAME, AND DEVICE FABRICATING METHOD

(75) Inventor: Ken-ichiro Mori, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/243,887

(22) Filed: Sep. 13, 2002

(65) Prior Publication Data

US 2003/0053217 A1    Mar. 20, 2003

(30) Foreign Application Priority Data

Sep. 14, 2001   (JP)   ............... 2001-280458

(51) Int. Cl.
*G02B 27/10*   (2006.01)
*G03B 27/42*   (2006.01)

(52) U.S. Cl. ..................... 359/619; 355/53

(58) Field of Classification Search ........ 359/619–624, 359/6; 355/53
See application file for complete search history.

(56) References Cited

U.S. PATENT DOCUMENTS

| | | | |
|---|---|---|---|
| 4,841,341 A | | 6/1989 | Ogawa et al. |
| 5,253,110 A | * | 10/1993 | Ichihara et al. ............. 359/619 |
| 5,459,547 A | | 10/1995 | Shiozawa |
| 5,636,003 A | | 6/1997 | Tanitsu et al. ................ 355/67 |
| 5,636,005 A | | 6/1997 | Yasuzato |
| 5,684,567 A | | 11/1997 | Shiozawa |
| 5,790,239 A | * | 8/1998 | Komatsuda et al. .......... 355/53 |
| 6,049,374 A | | 4/2000 | Komatsuda et al. |

2001/0015797 A1   8/2001   Suzuki et al.

FOREIGN PATENT DOCUMENTS

| | | | |
|---|---|---|---|
| EP | 0 867 772 | | 9/1998 |
| EP | 1 014 196 A2 | | 6/2000 |
| EP | 1 069 600 A1 | | 1/2001 |
| EP | 1 114 802 | | 7/2001 |
| JP | 05-259029 | * | 8/1993 |
| JP | 6-13289 | | 1/1994 |
| JP | 8-8168 | | 1/1996 |
| JP | 8-286382 | | 11/1996 |
| JP | 10-92729 | | 4/1998 |
| JP | 11-150051 | * | 2/1999 |
| JP | 2001-176766 | | 6/2001 |

OTHER PUBLICATIONS

Translation of Korean Patent Office Communication for counterpart Application No. 10-2002-0055931.
People's Republic of China Patent Office Communication for counterpart Application No. 02143517.4.

(Continued)

*Primary Examiner*—Alicia M Harrington
(74) *Attorney, Agent, or Firm*—Morgan & Finnegan LLP

(57) ABSTRACT

An illumination apparatus includes a first light integrator including a first optical element that has a section vertical to an optical axis and defined by a plurality of first sides, the first light integrator uniformly illuminating an illuminated plane, and a second light integrator for uniformly illuminating the first light integrator so that an outline of an illumination range in which light incident upon the first light integrator illuminates the light incidence plane of the first light integrator includes a plurality of second sides each of which is not parallel with any one of the first sides.

14 Claims, 12 Drawing Sheets

OTHER PUBLICATIONS

Translation of People's Republic of China Patent Office Communication for counterpart Application No. 02143517.4 (Item BB).
English Abstract of Japanese Publication 11-176742 (Item B).
English Translation of Japanese Publication 11-176742 (Item B).

Office Action dated Jan. 24, 2006, corresponding to Japanese Patent Application No. 2004-146995.
English translation of Office Action dated Jan. 24, 2006, corresponding to Japanese Patent Application No. 2004-146995.

* cited by examiner

RELATIVE OFFSET ANGLE OF 22.5°

PRIOR ART

RELATIVE OFFSET ANGLE OF 0°

■ THE NUMBER OF OVERLAPS: 4
▨ THE NUMBER OF OVERLAPS: 6
▢ THE NUMBER OF OVERLAPS: 9

PRIOR ART

PRIOR ART

ILLUMINATION APPARATUS, EXPOSURE APPARATUS USING THE SAME, AND DEVICE FABRICATING METHOD

BACKGROUND OF THE INVENTION

The present invention relates to illumination apparatuses for using light from a light source to illuminate an illuminated plane, and more particularly to an illumination apparatus for illuminating a reticle or a mask (these terms are used interchangeably in the present application) which forms a pattern, in an exposure apparatus used in a photolithography process for fabricating semiconductor devices, liquid crystal display devices, image pick-up devices (CCD, and the like), thin-film magnetic heads, and the like.

In recent years, a demand on minute semiconductors has been increasingly stronger, and the minimum critical dimension has become less than 0.15 μm, approaching to 0.10 μm. The fine processing needs uniform illuminance to illuminate the mask, and a uniform effective light source distribution as an angular distribution of the exposure light to illuminate the mask and wafer, as well as a shorter wavelength of exposure light and an increased NA in a projection lens.

For uniform illumination of the mask without the uneven illuminance and the uniform effective light source distribution, a conventional optical system has used an illumination apparatus including two or more fly-eye lenses (including a combination of a glass rod lens or a cylindrical lens) or an internal reflection member and a fly-eye. In these configurations, the fly-eye lens of a back stage illuminates the mask plane evenly for the uniform illuminance, and the former fly-eye lens or the internal reflection member of the front stage illuminates the fly-eye lens of the back stage evenly for the uniform effective light source.

Uniform light that has a light intensity distribution with sharp edges enters the light incidence plane of the fly-eye lens of the back stage in this optical system. However, the uneven illuminance occurs when the edge of the light intensity distribution of the incident light enters only part of a rod lens in the fly-eye lens. A description will now be given of this problem with reference to FIGS. 14 and 15. Here, FIG. 14 is a schematic plan view showing a relationship between a light incidence plane of the fly-eye lens and light incident upon it. FIG. 15 is a sectional view taken along the longitudinal axis in FIG. 14 and illustrates a relationship among the fly-eye lens of the subsequent stage, the light intensity distribution of the incident light, and a light intensity distribution on the illuminated plane.

As shown in FIGS. 14 and 15, a fly-eye lens 20 includes five rod lenses 26a–26e defined by five wide lines (which are generalized by reference numeral 26 hereinafter unless otherwise specified), and receives incident light 10. FIG. 14 shows that the rod lens 26 has a square section vertical to the optical axis but, as described later, it may have a hexagon and other sectional shape. The light intensity distribution 12 also has a square shape for simplicity.

In forming a secondary light source at a light exit plane 24 of the fly-eye lens 20 and using the light from the secondary light source to Koehler-illuminates the target plane 40 through a condenser lens 30, a light incidence plane 22 of the fly-eye lens 20 is made optically conjugate with the illuminated plane 40 (i.e., in a relationship of an object plane and an image plane). Therefore, the light intensity distribution on the illuminated plane 40 is created by superimposing the light intensity distribution on the light incidence plane 22 of each rod lens 26 onto the illuminate plane 40.

For convenience, incident light 10 has a light intensity distributions 12a–12e (hereinafter, unless otherwise described, the reference numeral 12 generalizes them) corresponding to the rod lenses, but it will be understood that the incident light 10 corresponding to the light intensity distributions 12a and 12e enters only part of the rod lenses 26a and 26e.

Thus, when the edge of the light intensity distribution 12 of the incident light 10 entering the fly-eye lens 20 crosses the rod lens, the illuminated plane 40 comes to form the light intensity distribution 50 that includes five superimposed light intensity distributions 52a–52e as illustrated at the right side of the illuminated plane 40. Since the light intensity distributions 12a and 12e incident upon the rod lenses 26a and 26e at both ends are cut on the way, the illuminated plane 40 has the light intensity distributions 52a and 52e, and the synthesized light intensity distribution 50 has an uneven light intensity distribution lacking the part 53. As is understood from the configuration of the fly-eye lens shown in FIG. 14, the rod lenses 26 line up in a direction perpendicular to the paper of FIG. 15, and thus the stack of all of these rod lenses 26 will further intensify the concave part 53 of the light intensity distribution 50.

As an actual example of the light intensity distribution 50, FIGS. 17 and 18 show a result of the light intensity on the illuminated plane 40 when the edge of the light intensity distribution 10 entering the fly-eye lens 20 traverses the rod lens 26. Here, FIG. 17 shows a light intensity distribution on the illuminated plane 40 when the rod lens 26 has a square section corresponding to a square illuminated area of the illuminated plane 40. FIG. 18 shows a light intensity distribution on the illuminated plane when the rod lens 26 has a hexagonal or circular section corresponding to a hexagonal or circular illuminated area of the illuminated plane 40. FIGS. 17 and 18 indicate, respectively, that darker part has a lower light intensity, and each of them shows that uneven light intensity distribution is produced due to the edge of an incident light intensity distribution. Color versions of FIGS. 17 and 18 will be attached to this application for better understanding of the invention.

As one solution for this problem, as shown in FIGS. 19A and 19B, it is conceivable to arrange a stop 60a or 60b near the light incidence plane 22 of the fly-eye lens 20 to shield the light intensity distributions 12a and 12e. Here, FIGS. 19A and 19B are plan views of the stops 60a and 60b, respectively. The stop 60a has a hollow rectangular shape defined by an outside outline 62a and inside outline 64a, and the stop 60b has a hollow shape defined by an outside outline 62b and inside outline 64b. The incident light 10's light intensity distribution 12 has a square shape, and its outline is blurred by the stops 60a and 60b as illustrated. As a result, the edge of the light distribution does not traverse the rod lens 26, but resides at the border of the rod lens 26.

However, a method for enhancing evenness of a light intensity at a conventional illuminated plane has lowered illuminance and throughput at a mask and a wafer as illuminated planes, which will, in the long run, increase product cost.

In other words, a stop used at a light incidence plane of the fly-eye lens for increasing an even light intensity distribution on an illuminated plane causes a loss of a light amount due to shield of the light by the stop.

BRIEF SUMMARY OF THE INVENTION

Accordingly, it is an exemplary object of the present invention to provide an illumination apparatus that improves a light intensity distribution at an illuminated plane as well as improving a light amount loss and throughput degradation, an exposure device including such an illuminating apparatus, and a device fabricating method using the same.

An illumination apparatus of one aspect of the present invention includes a first light integrator including a first optical element that has a section vertical to an optical axis and defined by a plurality of first sides, the first light integrator uniformly illuminating an illuminated plane, and a second light integrator for uniformly illuminating the first light integrator so that an outline of an illumination range in which light incident upon the first light integrator illuminates a light incidence plane of the first light integrator includes a plurality of second sides each of which is not parallel to any one of the first sides, or so that an illumination range in which light incident upon the first light integrator illuminates the light incidence plane of the first light integrator may be unsymmetrical to any one of the first symmetry axes.

An illumination apparatus of another aspect of the present invention includes a first light integrator for uniformly illuminating an illuminated plane, the first light integrator including a first optical element that has a plurality of first symmetry axes is defined by a first sectional shape vertical to the optical axis, and a second light integrator for illuminating the first light integrator so that an illumination range in which light incident upon the first light integrator illuminates the light incidence plane of the first light integrator may be unsymmetrical to any one of the first symmetry axes, or the second light integrator including a second optical element that has a second sectional shape unsymmetrical with any one of the first symmetry axes and vertical to the optical axis.

These illumination apparatuses little by little shift positions from which edges of the light intensity distribution enter a light incidence plane of the first light integrator relative to a plane parallel to the optical axis, and alleviate uneven illuminance of the edges of the light intensity distribution on the illuminated plane. Conceptually, this corresponds to FIG. 15 above, where the positions of the light intensity distributions 12a and 12e shift relative to the row of rod lenses lined up in a direction vertical to the paper (e.g., gradually to the outside or inside) and therefore, the light intensity distributions 52a and 52e on the illuminated plane 40 shift (gradually to the inside or outside), thereby decreasing the concave 53 of the light intensity distributions. However, in reality, the light intensity distribution 10 also changes its shape relative to the row of rod lenses lined up to a direction vertical to the paper, and is not equal to complete superimposition between the position-shifting light intensity distribution 52a and 52e.

The above illumination apparatuses simply change relative positions between two integrators, and prevent a light amount loss and throughput reduction, not by requiring a stop to be installed before the first integrator. Preferably, the above illumination apparatus arrange the light incidence planes of the first and second integrators approximately optically conjugate to each other, preventing an optical loss and throughput reduction due to blurring.

The first optical element is, for example, a rod lens with a hexagonal or rectangular section, and the first light integrator may be a fly-eye lens. For example, if an illuminated plane is a rectangle like a typical mask plane, a rod lens of the first fly-eye lens will become a rectangle to reduce shield of illumination light. A rod lens with a hexagonal section is particularly preferable for a triple integrator configuration, which will be described later.

If the first optical element is, for example, a rod lens with a hexagonal or rectangular section, and the first light integrator is a fly-eye lens, the second sides may include a side that forms about 15° relative to one of the first sides, or the second sectional shape has a second symmetry axis that forms an angle of 15° relative to one of the first symmetry axes. This is because a regular hexagon has symmetry axes every 30°, and thus positions of the rod lenses that the edge of the light intensity distribution traverses will not be the same for the rod lenses if about 15° shifts.

Similarly, if the first optical element is a rod lens having a rectangular section, and the first light integrator is a fly-eye lens, the second sides may include a side that forms an angle of about 22.5° relative to one of the first sides, or the second sectional shape may have a second symmetry axis that forms an angle of about 22.5° relative to one of the first symmetry axes. This is because a square has symmetry axes every 45°, and thus the positions of the rod lenses that the edge of the light intensity distribution traverses will not be the same for the rod lenses if about 22.5° shifts.

The second light integrator may be, for example, a fly-eye lens having a rod lens having a rectangular section. If a light source is, for example, a laser light source, a square section is desirable as it corresponds to a shape of incident light.

The illuminated plane may be almost uniformly illuminated using a secondary light source created at a light exit plane of the first light integrator. Alternatively, the illumination apparatus may further include a third light integrator whose a light incidence plane is the illuminated plane, and a secondary light source created at the light exit plane of the third light integrator is used to almost uniformly illuminate another illuminated plane. The present invention is applicable to double and triple integrator configurations.

In particular, in a triple integrator where another illuminated plane is, for example, rectangular like a typical mask plane, a rod lens of a third fly-eye lens may be rectangular to reduce shield of illumination light, and a rod lens of the first fly-eye lens may be a hexagon or rectangle so that an effective light source may be a circle that has specific conditions for the third fly-eye lens (e.g., coherence factor σ). To obtain a circular illuminated area, a hexagon is preferable for light utilization efficiency.

An exposure apparatus of another aspect of this invention includes the above illumination apparatus and a projection optical apparatus that projects a pattern of a reticle or a mask onto an object to be exposed. Such an exposure apparatus may make an effective light source distribution uniform for a retile or a mask as the illuminated plane or the other illuminated plane, similar to the above illumination apparatus.

A device fabricating method of still another aspect of the present invention includes the steps of projecting the object to be exposed by using the above exposure apparatus, and performing a predetermined process for the object projected. Claims for the device fabricating method that exhibits operations similar to those of the above exposure apparatus cover devices as their intermediate products and finished products. Moreover, such devices include, e.g., semiconductor chips such as LSIs and VLSIs, CCDs, LCDs, magnetic sensors, thin-film magnetic heads, etc.

An illumination optical system of one aspect of the present invention includes a first optical system for using light from a light source to illuminate a plurality of condensing systems of a light integrator, and a second optical system for using beams from the plurality of condensing systems to illuminate an illuminated plane, wherein a plurality of beams from some of the plurality of condensing systems each illuminate the whole illuminated plane, wherein the plurality of beams from the remaining condensing systems each illuminate only part of the illuminated plane, and have different illumination ranges different from each other.

An illumination optical system of another aspect of the present invention includes a first optical system for using light from a light source to illuminate a plurality of condensing systems of a light integrator, and a second optical system for using beams from the plurality of condensing systems to illuminate an illuminated plane, wherein each of a plurality of sides for forming an outline of an illumination range in which light from the first optical system illuminates a light incidence plane of the light integrator is not parallel to any one of a plurality of sides for forming outlines of respective light incidence planes of the plurality of condensing systems. Alternatively, an illumination range in which light from the first optical system illuminates the light incidence plane of the light integrator may have a plurality of symmetry axes, wherein the respective light incidence planes of the plurality of condensing optical systems are unsymmetrical to the symmetry axes and a plurality of straight lines parallel to the symmetry axes.

These illumination apparatuses little by little shift positions from which edges of the light intensity distribution enter a light incidence plane of the first light integrator relative to a plane parallel to the optical axis, and alleviate uneven illuminance of the edges of the light intensity distribution on the illuminated plane. In addition, the illumination apparatuses simply change relative positions between two integrators, and prevent a light amount loss and throughput reduction, not by requiring a stop to be installed before the first integrator.

An illumination optical system of still another aspect of the present invention includes a first optical system for using light from a light source to illuminate a plurality of condensing systems, and a second optical system for using beams from the plurality of condensing systems to illuminate an illuminated plane, wherein the first optical system includes a first light integrator that includes a plurality of condensing systems, and wherein each of a plurality of sides for forming an outline of a light incidence plane of each condensing system in the light integrator is not parallel to any one of a plurality of sides for forming an outline of a light incidence plane of each condensing system in the first light integrator. This illumination apparatus little by little shifts positions from which edges of the light intensity distribution enter a light incidence plane of the first light integrator relative to a plane parallel to the optical axis, and alleviates uneven illuminance of the edges of the light intensity distribution on the illuminated plane.

An illumination optical system of another aspect of the present invention includes a first optical system for using light from a light source to illuminate a plurality of condensing systems in a light integrator, and a second optical system for using light from the plurality of condensing systems to illuminate an illuminated plane, wherein the first optical system includes a first light integrator having a plurality of condensing systems, and wherein the second optical system includes a second light integrator having a plurality of condensing systems, and wherein each side on an outline of a light incidence plane of each condensing system of the light integrator is not parallel to any one of sides on outlines of a light incidence plane of condensing systems in the first light integrator, and wherein the light incidence plane of the light integrator and the light incidence plane of the second light integrator are optically disconjugate to each other. Alternatively, the light incidence plane of the second light integrator and the illuminated plane may be optically conjugate to each other.

Other objects and further features of the present invention will become readily apparent from the following description of the embodiments with reference to accompanying drawings.

DETAILED DESCRIPTION OF THE PREFERRED EMBODIMENTS

Figure 1:
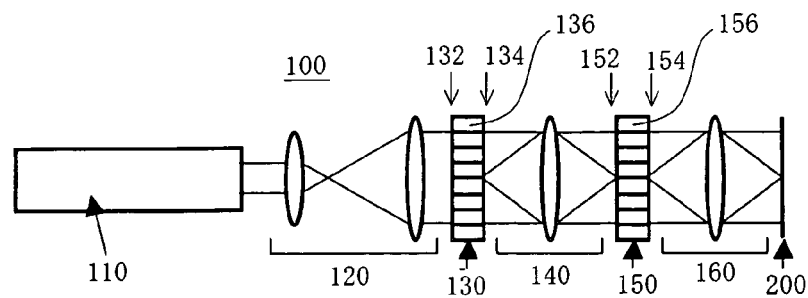
FIG. 1 shows a simplified optical path in an illumination apparatus of the present invention.
Figure 10:
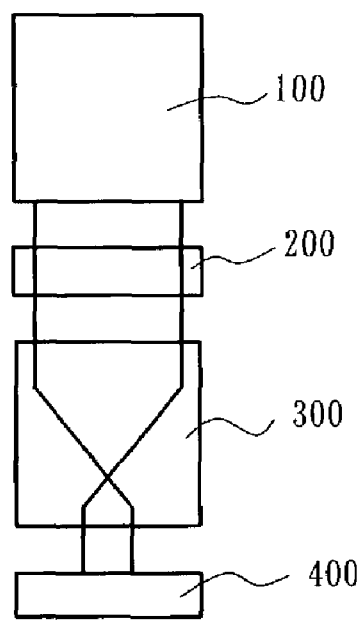
FIG. 10 shows a simplified optical path in an exposure apparatus that includes the illumination apparatus shown in FIG. 1.

A description will now be given of an exposure apparatus 1 and an illumination apparatus 100 as one aspect of the present invention with reference to accompanying drawings. Here, FIG. 10 is a schematic view showing a simplified optical path of the exposure apparatus 1. The exposure apparatus 1 includes the illumination apparatus 100, a reticle 200, a projection optical system 300 and a plate 400. FIG. 1 is a schematic diagram showing an exemplarily simplified optical path of the illumination apparatus 100.

The exposure apparatus 1 of this embodiment is a projection exposure apparatus that exposes a circuit pattern created on the mask 200 in a step-and-scan manner onto the plate 400, but the present invention can apply a step-and-repeat manner and other modes of exposure method. The "step-and-scan" manner, as used herein, is one mode of exposure method that exposes a mask pattern onto the plate by continuously scanning the plate relative to the mask and by moving, after a shot of exposure, the plate stepwise to the next exposure area to be shot. The "step-and-repeat" manner is another mode of exposure method that moves the plate stepwise to an exposure area for the next shot every shot of cell projection onto the plate.

The illumination apparatus 100 illuminates the reticle 200 that forms a circuit pattern to be transferred without illuminance unevenness and with a uniform effective light source, and includes a light source part and an illumination optical system. The light source part includes a light source 110 and a beam shaping optical system 120.

The light source 110 employs laser beams such as an ArF excimer laser with a wavelength of 193 nm, a KrF excimer laser with a wavelength of 248, an $F_2$ excimer laser with a wavelength of 157 nm, etc. in this embodiment. However, the present invention does not limit a type of laser to the excimer laser, and thus may use a YAG laser, for example. Also, it does not limit the number of laser units. The light source can be, for example, an ultra-high pressure mercury lamp, or a xenon lamp generally having an output of 500 W or more. A laser 110 may be g-line (with a wavelength of about 436 nm), or i-line (with a wavelength of about 365 nm) of a mercury lamp.

The beam shaping system 120 may use, for example, a beam expander, etc., with a plurality of cylindrical lenses, and convert an aspect ratio of the size of the sectional shape of parallel beams from the laser 110 into a desired value (for example, by changing the sectional shape from a rectangle to a square), thus reshaping the beam shape to a desired one. The beam shaping system 120 forms a beam that has a size and divergent angle necessary for illuminating an optical integrator 150 described later.

Preferably, the light source part uses an incoherently turning optical system, though it is not shown in FIG. 1, which turns a coherent laser beam into an incoherent one. The incoherently turning optical system may use, for example, at least one return system that splits an incident beam into at least two beams (e.g., p polarized light and s polarized light) at a light splitting plane, provides one of them, relative to the other beam, with an optical path length difference more than the coherence length of a laser beam via an optical member, and then leads it to the light splitting plane again so that the superimposed light is emitted.

The illumination optical system illuminates the mask 200, and includes fly-eye lenses 130 and 150, and condenser lenses 140 and 160. Thus, the illumination optical system in this embodiment uses a double integrator configuration that has two light integrators.

The fly-eye lenses 130 and 150 serve to illuminate the target plane evenly, and are wavefront splitting type optical integrators that split the wavefront of incident light and form multiple light sources at a light exit plane or in its neighborhood. The fly-eye lenses 130 and 150 convert an angular distribution of the incident light into a positional distribution in emitting the light. The respective light incidence planes 132 and 152 and the light exit planes 134 and 154 of the fly-eye lenses 130 and 150 are in a Fourier transformation relationship. The Fourier transformation relationship in the present specification means an optical relationship between a pupil plane and an object plane (or an image plane), and an object plane (an image plane) and a pupil plane. Thus, the neighborhood of the light exit planes 134 and 154 of the fly-eye lenses 130 and 150 is a secondary light source.

Figure 21A:
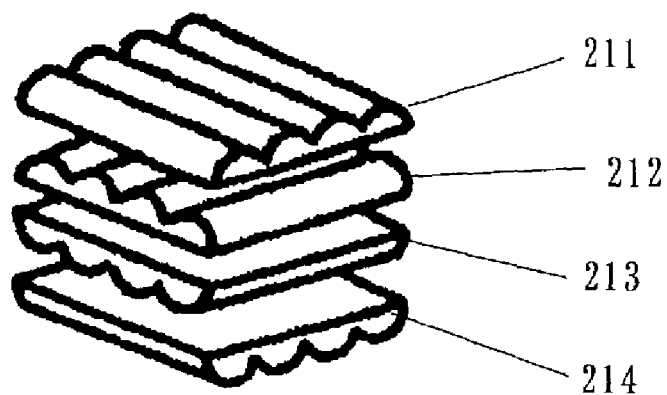
FIG. 21 typically shows an arrangement of a plurality of cylindrical lenses.

The fly-eye lenses 130 and 150 include a combination of many rod lenses (or fine lens elements) in this embodiment. However, the wavefront splitting type optical integrator applicable to this invention is not limited to a fly-eye lens. It may be, for example, as shown in FIG. 21, multiple sets of cylindrical lens array plates in which respective sets are arranged orthogonal to each other. A fly-eye lens having a rod lens with three or more refracting interfaces may be used.

Figure 21B:
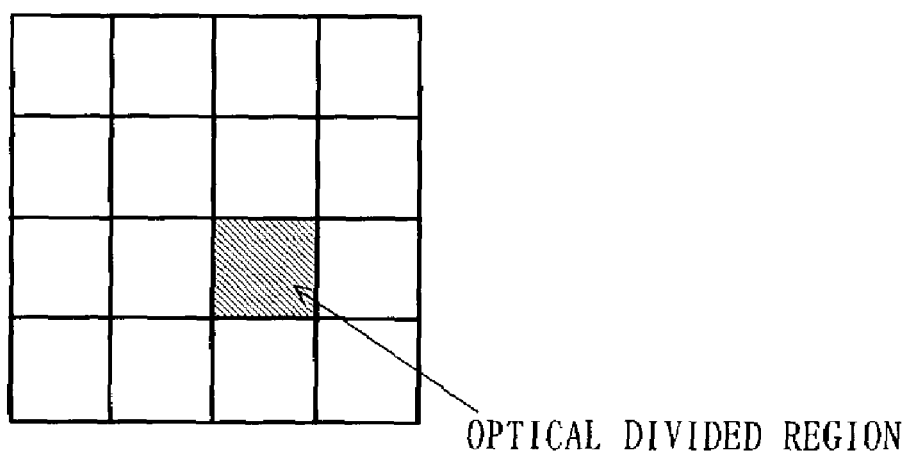

Here, cylindrical lens array plates are formed by stacking two sets of cylindrical lens array plates (or lenticular lenses). The cylindrical lens array plates of the first set 211 and the fourth set 214 in FIG. 21A each have a focal length f1, and the cylindrical lens array plates of the second set 212 and the third set 213 have a focal length f2 different from f1. A cylindrical lens array plate in the same set is arranged at the focal position of its counterpart. Two sets of cylindrical lens array plates are arranged such that mutual bus directions are orthogonal to each other, and create beams that differ in F number in the orthogonal direction (or lens focal length/ effective aperture). Of course, the number of sets is not limited to two. So long as multiple cylindrical lenses that have orthogonal mutual bus directions, the number of cylindrical lenses is not limited. In FIG. 21B that transparently shows a set of cylindrical lenses in FIG. 21 viewed from the optical axis direction (or a longitudinal direction in FIG. 21A), areas that are apparently partitioned off by borderlines of cylindrical lenses 211, 212, 213, and 214 (called light splitting areas hereinafter) in FIG. 21A correspond to 'first optical element', 'second optical element', 'condensing system' and similar terms in claims. Sides that form respective light splitting areas correspond to 'first side', 'second side', 'multiple sides forming light incidence planes of plurality of condensing systems' and similar terms in claims.

The fly-eye lens 130 is provided to illuminate the fly-eye lens 150 evenly, while the fly-eye lens 150 is provided to illuminate the mask 200 evenly.

The rod lens in the fly-eye lens 130 has a rectangular section in this embodiment, while the rod lens of the fly-eye lens 150 has a rectangular or a hexagonal section in this embodiment. Here, the term "section" is a section relative to a plane perpendicular to the optical axis. A shape of the fly-eye lens 130's rod lens corresponds to a shape of a beam passing through the shaping optical system 120, and can create a rectangular angular distribution. The fly-eye lens 150's rod lens has a rectangular shape if the mask 200 plane has a rectangular shape. If the mask 200 plane is a circle, it will have a hexagonal shape since it is more effective to produce a circle from a hexagon than from a square.

The light incidence plane 132 of the rod lens in the fly-eye lens 130 and light incidence plane 152 of the fly-eye lens 150 are approximately conjugate. This will prevent a loss of a light amount and lowered throughput due to blurring.

Figure 2A:
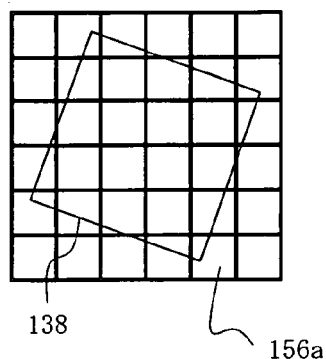
FIG. 2 is a plan view showing an arrangement of two fly-eye lenses shown in FIG. 1 for each of two shapes that the latter fly-eye lens can take.
Figure 2B:
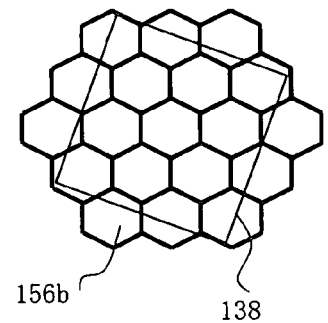

Referring to FIG. 2, a description will now be given of a relationship between the light incidence plane 152 of the fly-eye lens 150 and the shape of the light intensity distribution of approximately uniform illumination light that illuminates the light incidence plane 152 with the light exit plane 134 of the fly-eye lens 130 as a secondary light source. Here, FIG. 2A is a plan view showing a relationship between the light incidence plane 152 and incident light when the fly-eye lens 150 has a rod lens 156 of a square section. FIG. 2B is a plan view showing a relationship between the light incidence plane 152 and incident light when the fly-eye lens 150 has a rod lens 156b of a hexagonal section.

As described above, the rod lens 136 in the fly-eye lens 130 has a square shape, and the light intensity distribution of the illumination light that illuminates the light incidence plane 152 with the neighborhood of light exit plane 134 as a secondary light source has an outline shape of a square 138.

In this embodiment, each side of the square 138 is not parallel to any side of the square as the sectional shape of the rod lens 156a shown in FIG. 2A or is not parallel to any side of the hexagon as the sectional shape of the rod lens 156b shown in FIG. 2B. Although the shape of the rod lens 136 is not shown for illustrative purposes, such a shape corresponds to what is created by dividing the square 138 into five rows and five lines. Thus, each side of a square that is the sectional shape of the rod lens 136 is not parallel to any side of the square that is the sectional shape of the rod lens 156a shown in FIG. 2A or is not parallel to any side of the hexagon that is the sectional shape of the rod lens 156b shown in FIG. 2B.

Figure 3A:
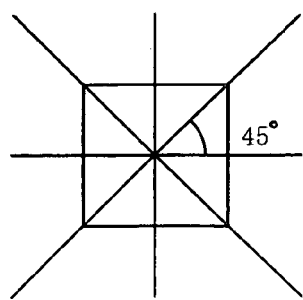
FIG. 3 is a plan view for explaining rotational symmetry axes of a square and a regular hexagon.
Figure 3B:
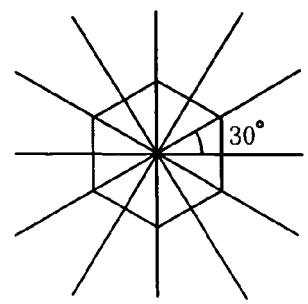

As to the symmetry axes, as shown in FIG. 3A, a square has a symmetry axis at an interval of 45°, and as shown in FIG. 3B, a hexagon has a symmetry axis at an interval of 30°. Here, FIG. 3 is a plan view for explaining the symmetry axes for the square and hexagon. The square 138 is unsymmetrical to any symmetry axis of the rod lens 156a shown in FIG. 2A, and unsymmetrical to any symmetry axis of the rod lens 156b shown in FIG. 2B.

In this embodiment, the square 138 as a light intensity distribution shape forms about 22.5° relative to one side of the rod lens 156a, and about 15° relative to one side of the rod lens 156b. A square has a symmetry axis every 45°, and therefore when about 22.5° shifts, the position of the rod lens that the edge of the light intensity distribution ('illumination range' in claims) traverses is not the same for each rod lens row. Here, an angle formed between any one of multiple sides forming the light intensity distribution and any one of multiple sides forming the light incidence plane of the rod lens (or light splitting area stated in FIG. 21B in case of a cylindrical lens) is not limited to 22.5°. Rather, an angle between 18° and 30° would substantially provide similar effects to some extent. A regular hexagon for either or both of the light intensity distribution and the light incidence plane of the rod lens would provide symmetry axes every 30°, and thus the angle set to be about 15° between any one of the multiple sides that form the light intensity distribution and any one of the multiple sides that form the light incidence plane of the rod lens change positions of the rod lens that the edge of the light intensity distribution traverses with respect to each rod lens row. Here, the angle formed by the above two is not limited to 15°, and thus the angle between 12° and 20° would substantially provide similar effects.

If necessary, a stop (not shown) may be provided near the light exit plane 154 of the fly-eye lens 150. The stop is a variable aperture stop that shields unnecessary light to form a desired secondary light source, and various stops are available such as a circular aperture stop, a stop for annular illumination, etc. The replacement of the variable aperture stop may use, for example, a disc turret that forms these aperture stops, and a controller and a drive mechanism (not shown) turns the turret to switch the opening.

A condenser lens 140 superimposes light exiting the fly-eye lens 130 onto the light incidence plane 152 of the fly-eye lens 150, thus illuminating the fly-eye lens 150 uniformly. Since a stop 60a or 60b does not exist between the condenser lens 140 and fly-eye lens 150, a loss of a light amount and a lowering of throughput due to the stop can be evaded. The condenser lens 160 superimposes the light exiting the fly-eye lens 150 onto the mask 200 plane, thus uniformly illuminating the mask 200 plane.

If necessary, a masking blade (a stop or a slit) for controlling an exposure area being scanned may be provided. Then, the condenser lens 160 condenses as many beams as possible that are wavefront-split by the fly-eye lens 150, and superimposes them with the masking blade, thus Koehler-illuminating the mask 200 plane uniformly. The masking blade and the light exit plane 154 of the fly-eye lens 150 are arranged in a Fourier transformation relationship, and disposed in a relationship appropriately conjugate with the mask 200 plane. The exposure apparatus 1 may, if necessary, further include a width-variable slit for eliminating the illuminance unevenness.

The masking blade has, for example, an almost rectangular aperture when a projection optical system 300 is of a lens type, and has a circular aperture if the optical system 300 is a reflection mirror system of the Offer type. A beam having passed through the aperture in the masking blade is used as an illumination beam for the mask 200. The masking blade is a stop that has an automatically variable opening width, and can longitudinally change the transfer area (of the opening slit) of the plate 400 described later. The exposure apparatus 1 may further include a scan blade having a structure, similar to the above masking blade for horizontally changing the transfer area of the plate 400. The scan blade is also a stop whose opening width is automatically variable, and is provided at a position optically nearly conjugate with the mask 200 plane. As a result, the exposure apparatus 1 can use these two variable blades to establish the size of the transfer area in conformity with the size of an exposing shot.

The illumination apparatus 100 of this embodiment provides the high light utilization efficiency on the mask 200 plane as a plane to be illuminated, the approximately uniform effective light source distribution, and the approximately uniform light intensity distribution on the mask 200 plane.

Figure 14:
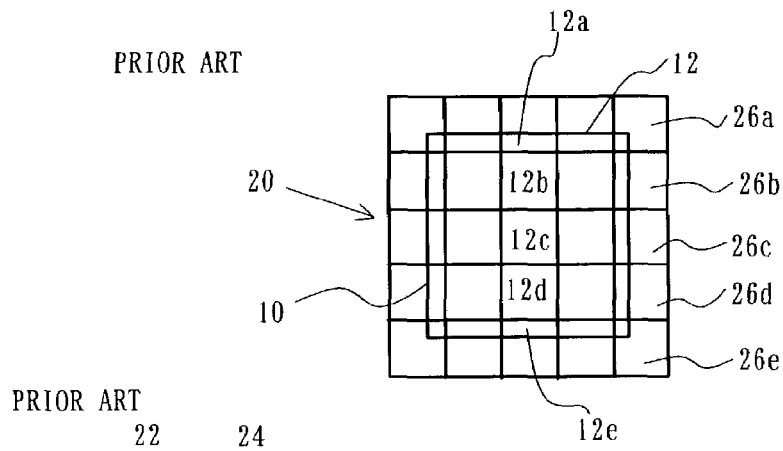
FIG. 14 is a plan view showing a relationship between a rod lens in a fly-eye lens of a back stage in an illumination apparatus including two conventional fly-eye lenses, and a shape of a light intensity distribution of incident light.

As shown in FIG. 14, a plurality of rod lenses are arranged longitudinally and horizontally at the light incidence plane of the fly-eye lens 20, which cross the edge of the light intensity distribution 12. In FIG. 14, the rod lenses that are illuminated in the same condition as the edge 12e of the light intensity distribution 12 (in which only the upper side of the rod lens is illuminated) are the second, third, and fourth lenses from left in the bottom row in FIG. 14, i.e., three out of twenty-five rod lenses.

Figure 15:
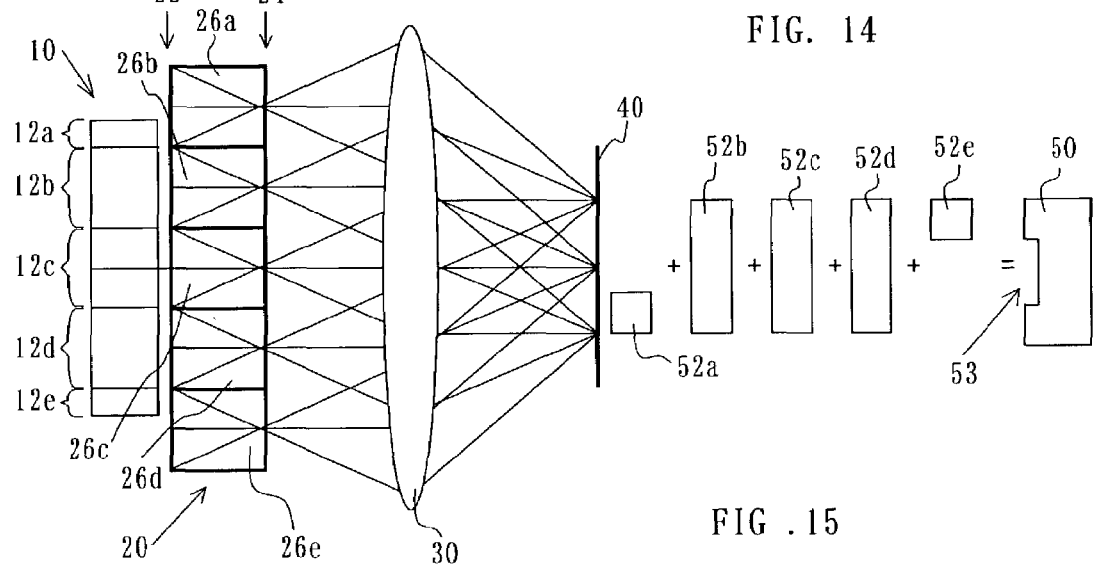
FIG. 15 is a schematic sectional view showing a light intensity distribution on the illuminated plane formed by a fly-eye lens that has received the incident light shown in FIG. 14.
Figure 16A:
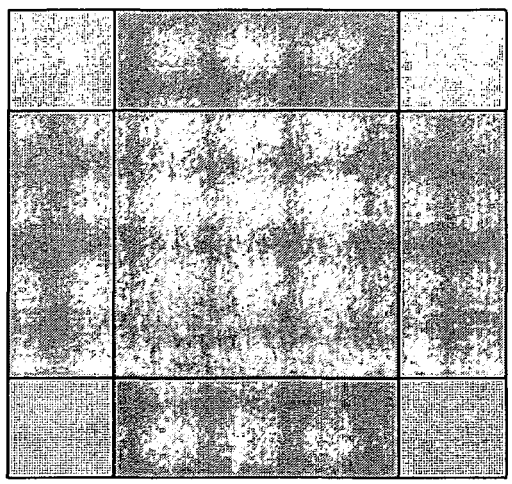
FIG. 16 two-dimensionally shows the light intensity distribution on the illuminated plane shown in FIG. 15.
Figure 16B:
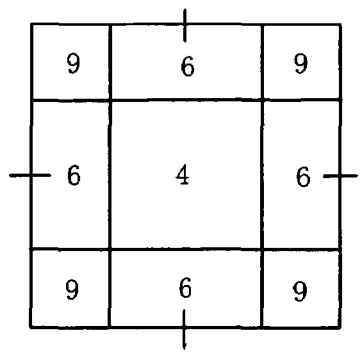

Accordingly, the light intensity distribution 50 in the illuminated plane 40 is as shown in FIG. 15. FIG. 15 is a sectional view of the optical system in the plane that covers a straight line that goes through 12a, b, c, d, and e in FIG. 14 and the optical axis. Viewing this light intensity distribution 50 two-dimensionally is as shown in FIG. 16. The number of rod lenses is 5×5=25 in FIG. 14, whereas 4×4=16 in FIG. 16. This figure explains the principle, and thus despite the different number of rod lenses, it is apparent that the same light intensity distribution can be obtained. The same is applied to FIGS. 17 and 18. FIG. 16 corresponds to FIG. 17, which will be described later. A color version of FIG. 16 will be attached to this application for better understanding of this invention. Numbers in FIG. 16A indicate the number of additions of the light intensity distributions of respective rod lenses 26. For better understanding, FIG. 16B writes typical overlapping times on the illumination ranges. In FIG. 16, a shift from the fly-eye lens 20 in the front stage is 0°, and the sides of the sectional shape of the rod lenses in both fly-eye lenses are mutually parallel.

On the contrary, the rod lens 156a that traverses the edge of the light intensity distribution 138 at the light incidence plane 152 of the fly-eye lens 150 is unfixed in the longitudinal and horizontal directions shown in FIG. 2, being shifted little by little. For example, the edge of the light intensity distribution 138 crosses the second, third, and fourth rod lenses 156a in the bottom from the right, but does not cross the first, fifth or sixth rod lenses 156a from the right. Understandably, perpendicular and horizontal views will change positions of the rod lenses 156a that the light intensity distribution crosses, as well as the shape and the size of the area that the light intensity distribution crosses. Here, the number of the rod lenses is different from the number of rod lenses in FIGS. 15, 16, and others, but the number is not matter for the principle and a description of the principle using FIG. 2 is proper.

The configuration shown in FIG. 2 thus alleviates uneven illuminance at the edge of the light intensity distribution at the mask 200 plane as the illuminated plane. This corresponds to FIG. 15 where the positions of the light intensity distributions 12a and 12e shift (for example, gradually to the outside or inside) with respect to the rod lenses arranged in a direction perpendicular to the paper, and the light intensity distributions 52a and 52e on the illuminated plane 40 shift (gradually to the inside or outside), diminishing the concave part 53 of the light intensity distribution 50. Nevertheless, as described above, the shape of the light intensity distribution 10 also changes in reality relative to the rod lenses arranged to the direction perpendicular to the paper, and does not cause the perfect superimposition of the shifted positions of the light intensity distributions 52a and 52e. At any rate, it will be understood that the configuration shown in FIG. 2 provides the uniform shape of the effective light source.

Figure 12A:
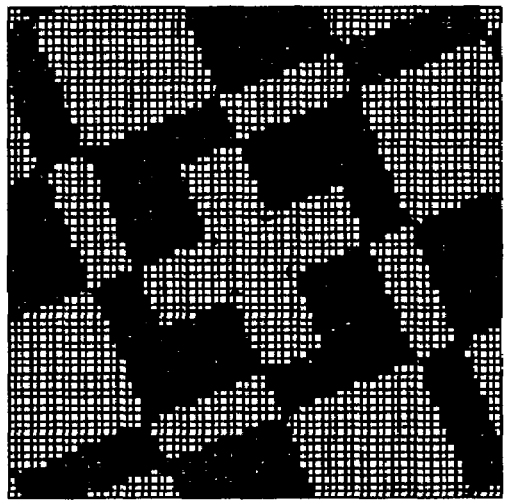
FIG. 12 is a typical plan view of a light intensity distribution on the illuminated plane when the configuration shown in FIG. 2 is used.
Figure 12B:
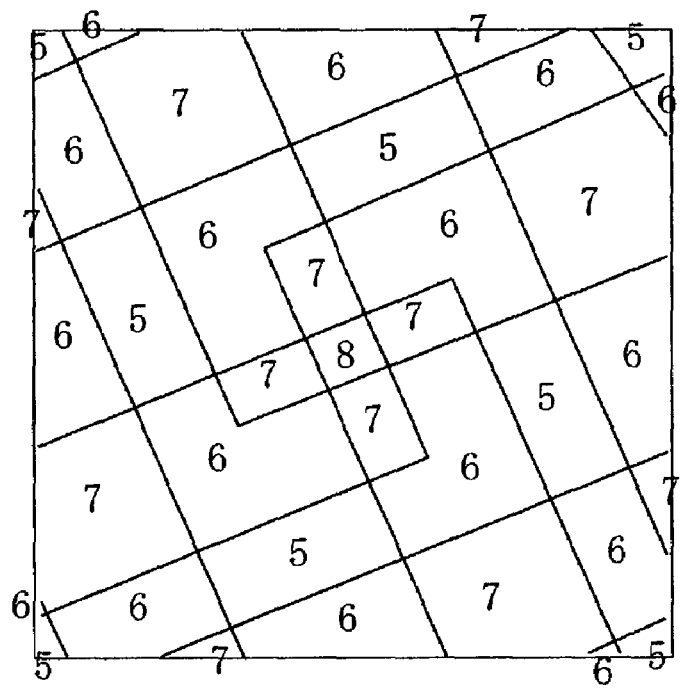

FIG. 12 shows a light intensity distribution on the illuminated plane 200 with the configuration shown in FIG. 2. FIG. 12 corresponds to FIG. 4, which will be described later. A color version of FIG. 12 will be attached to this application for better understanding of this invention. Numbers in FIG. 12A indicate the number of additions of the light intensity distributions of respective rod lenses 156a. For better understanding, FIG. 12B writes typical overlapping times on the illumination ranges. FIG. 12 shows the light intensity distribution on the illuminated plane 200 when a relative offset angle between the fly-eye lenses 130 and 150 is 22.5°.

Figure 13:
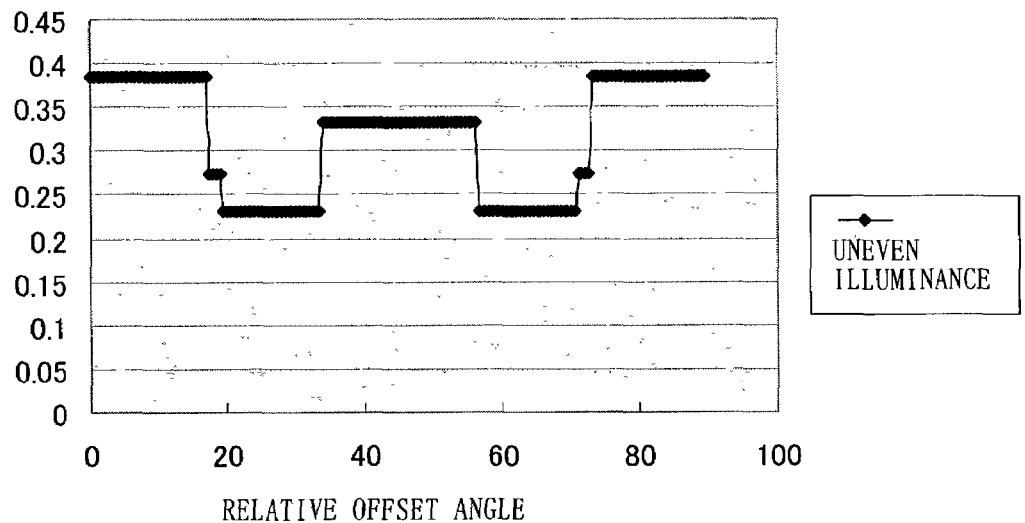
FIG. 13 is a graph showing a relationship between a relative offset angle between two fly-eye lenses and uneven illuminance on the illuminated plane when the configuration shown in FIG. 2 is used.

FIG. 13 a relationship between the relative offset angle between the fly-eye lenses 130 and 150 and the illuminance unevenness in the configuration shown in FIG. 2. Understandably, as shown in FIG. 16, when the relative offset angle is 0°, the illuminance unevenness on the illuminated plane 200 is relatively high as about 0.37. On the other hand, as shown in FIG. 12, when the relative offset angle is 22.5°, the illuminance unevenness on the illuminated plane 200 is improved down to 0.23. In FIG. 12, when the relative offset angle is not 22.5°, but is in the range from 18° to 30°, the uneven illuminance can be made smaller like the relative offset angle of 22.5° than that with the relative offset angle of 0°. Therefore, the relative offset angle is not limited to 22.5°, but rather it may be between 18° and 30°. When the shape of a light splitting area (shown in FIG. 21) differs from the exemplified, e.g., when either is or both are a regular hexagon, the relative offset angle is preferably 15°, but the angle between 12° and 20° would provide almost similar effects.

Figure 4:
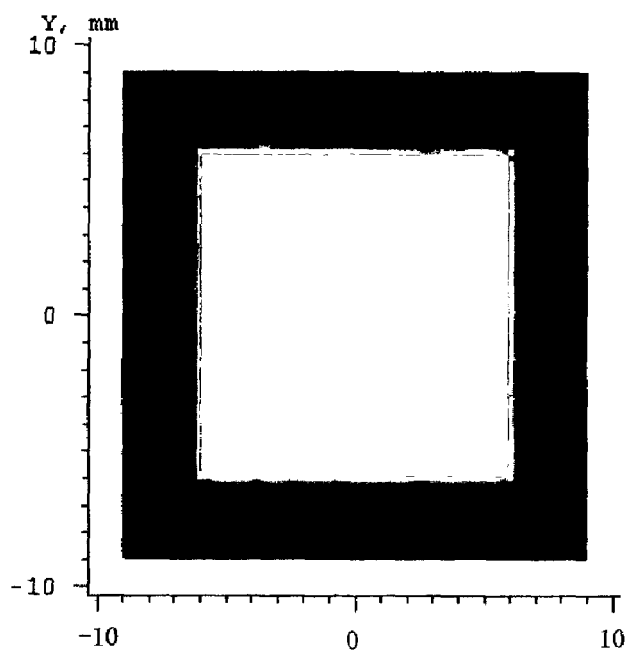
FIG. 4 is an improved light intensity distribution on an illuminated plane in the illumination apparatus shown in FIG. 1 when the rod lens has a square section.
Figure 5:
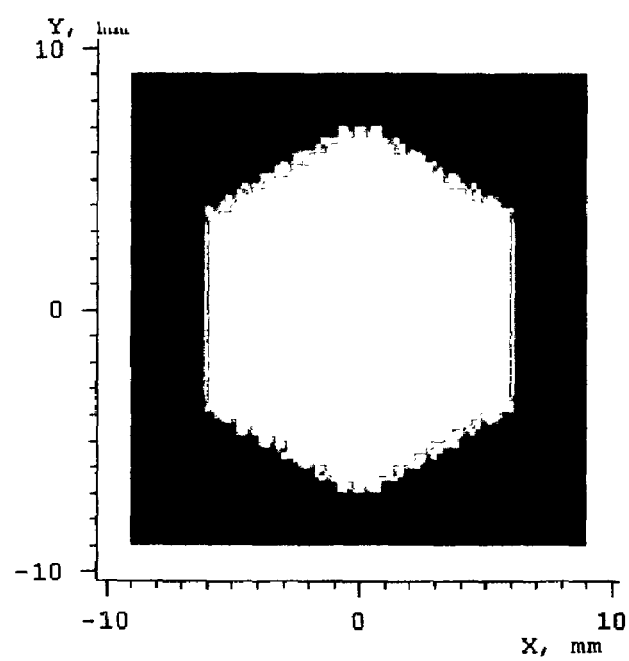
FIG. 5 is a light intensity distribution improved in the illuminated plane in the illumination apparatus shown in FIG. 1 when the rod lens has a hexagonal section.
Figure 17:
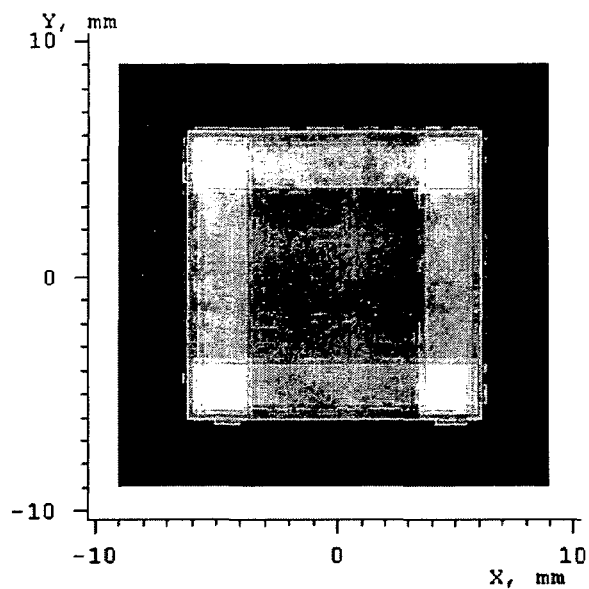
FIG. 17 is a light intensity distribution on the illuminated plane when the rod lens in the fly-eye lens of the back stage in a conventional illumination apparatus has a square section.
Figure 18:
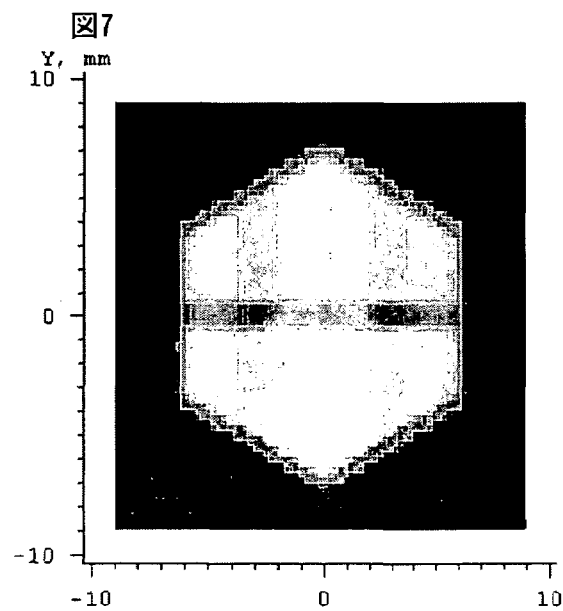
FIG. 18 is a light intensity distribution on the illuminated plane when the rod lens in the fly-eye lens of the back stage in a conventional illumination apparatus has a hexagonal section.
Figure 19A:
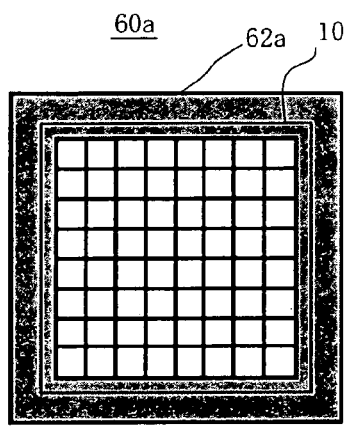
FIG. 19 is a schematic plan view of a stop for improving an uneven light intensity distribution on the illuminated plane shown in FIG. 15.
Figure 19B:
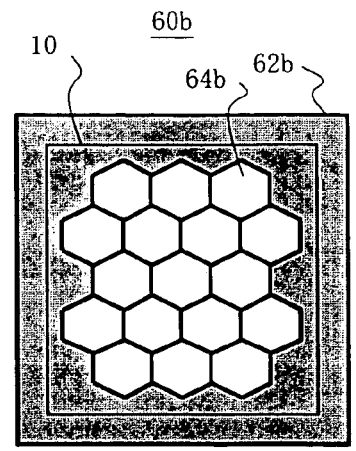

FIG. 4 shows a simulated calculation result of the light intensity distribution by tilting the light intensity distribution at the light incidence plane 152 of the fly-eye lens 150 or the fly-eye lens 130 by 22.5° under the conditions in FIG. 17, and by setting a side of the light intensity distribution in the rod lens 156a to be non-parallel or unsymmetrical with a side of the rod lens 156a. Similarly, FIG. 5 shows a simulated calculation result of the light intensity distribution by tilting the light intensity distribution at the light incidence plane 152 of the fly-eye lens 150 or the fly-eye lens 130 by 15° under the conditions of FIG. 18, and by setting a side of the light intensity distribution in the rod lens 15b to be non-parallel or unsymmetrical with a side of the rod lens 15b. It will be understood that in either case, although some uneven light intensity distribution remains, the evenness is improved compared with those in FIGS. 17 and 18. A color version of FIGS. 4 and 5 will be attached to this application for better understanding this invention.

Figure 6:
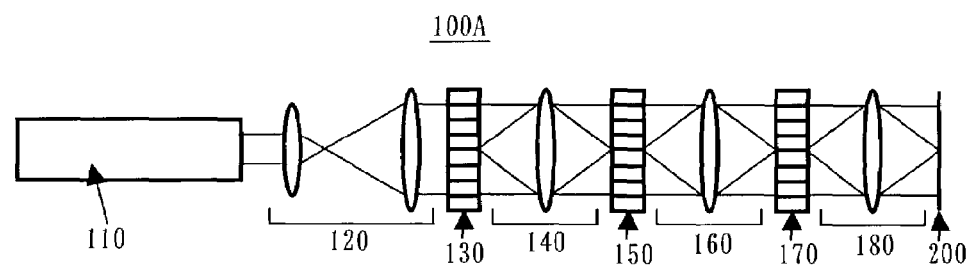
FIG. 6 shows a simplified optical path in a variation of the illumination apparatus shown in FIG. 1.
Figure 7:
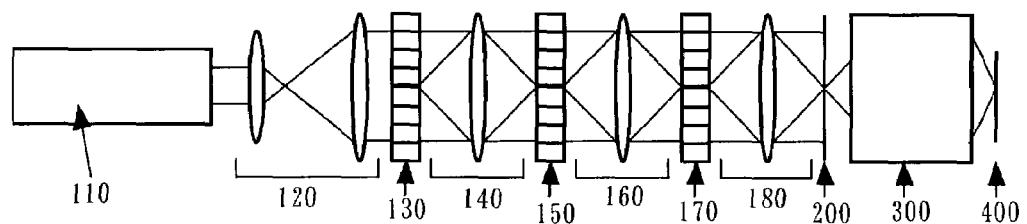
FIG. 7 shows a simplified optical path in an exposure apparatus that includes the illumination apparatus shown in FIG. 6.

A description will now be given of a variation of the illumination apparatus 100 with reference to FIG. 6. Here, FIG. 6 is a schematic view of a simplified optical path in an illumination apparatus 100A as a variation of the illumination apparatus 100. FIG. 7 shows a simplified optical path in an exposure apparatus 1A that uses the illumination apparatus 100A is applied in place of the illumination apparatus 100.

The illumination apparatus 100A is an example of a triple-integrator configuration that further includes a fly-eye lens 170 and a condenser 180 after the condenser lens 160. A sectional shape of the rod lens of the fly-eye lens 170 is set to be rectangular, since the shape of the mask 200 plane is typically a rectangle. The condenser lens 180 superimposes the light exiting the fly-eye lens 170 on the mask 200 plane, illuminating the mask 200 plane uniformly. As described above, a masking blade and the like may be arranged between the condenser lens 170 and the mask plane.

In the optical system in the illumination apparatus 10A, the fly-eye lens 130 prevents any change in the light intensity distribution from the light source from giving any significant impact onto the illuminated plane 200, the fly-eye lens 150 makes the effective light source approximately uniform, and the fly-eye lens 170 makes the illuminance approximately uniform on the mask 200 plane as the illuminated plane.

The relationship among the light intensity distribution incident upon the fly-eye lens 150, the rod lens of the fly-eye lens 130, and the rod lenses 156a and 156b is exactly the same as that described referring to FIG. 2, and therefore a description thereof will be omitted.

This embodiment applies non-parallel and unsymmetrical arrangement for the light intensity distribution incident upon the fly-eye lens 170, the rod lens 156 of the fly-eye lens 150, and the rod lens of the fly-eye lens 170, like the relationship explained referring to FIG. 2. Thus, an arrangement of the fly-eye lens 170 improves uniform illumination further at the mask 200 plane as the illuminated plane. Here, for the relationship between the fly-eye lenses 150 and 170, the incident light intensity distribution may be blurred or a stop may be used as in the prior art.

Figure 20:
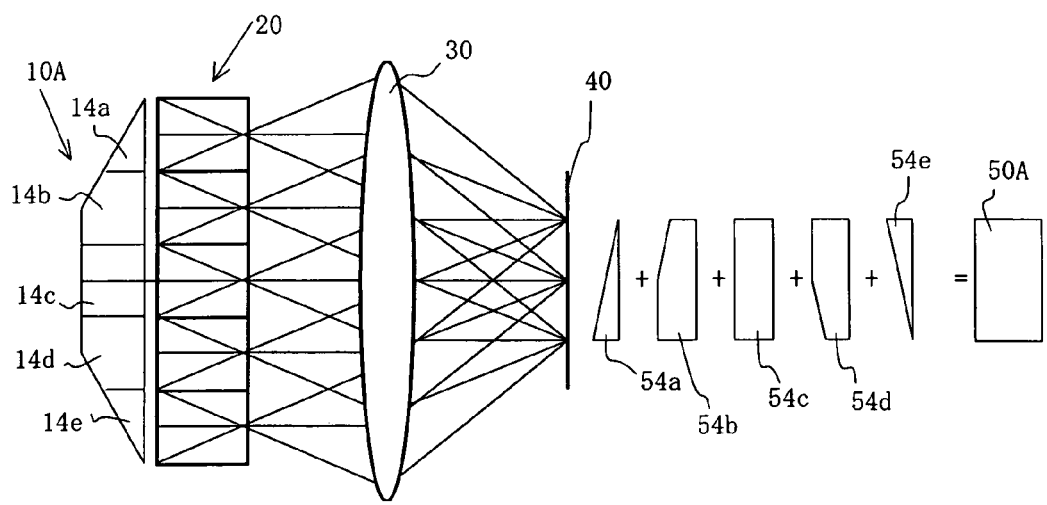
FIG. 20 is a typical drawing showing a relationship among the fly-eye lens of the back stage in the illumination apparatus, the light intensity distribution of incident light that has blurred edges, and the light intensity distribution on the illuminated plane.

A description will be given of an effect of "blur". In FIG. 14 as an explanatory view of prior art, it is conceivable to blur the edge parts 12a and 12e of the light intensity distribution 12. This may be realized, for example, by shifting the light incidence plane 22 of the fly-eye lens 20 from the position conjugate with the light incidence plane of the rod lens in the fly-eye lens of the front stage. FIG. 20 shows an example of blurring FIG. 14. Here, FIG. 20 is a typical view showing a relationship among the fly-eye lens of the back stage, the light intensity distribution of the incident light that has the blurred periphery, and the light intensity distribution of the illuminated plane. As shown in FIG. 20, the incident light 10A has the light intensity distributions 14a–14e (hereinafter, unless otherwise described, the reference numeral 14 generalizes them) and exhibits the gently inclined light intensity distributions 14a and 14b, and 14d and 14e. When the incident light 10A entering the fly-eye lens 20 has the edge of the light intensity distribution 14 blurred in this way, the illuminated plane 40 forms a uniform light intensity distribution 50A that superimposes five light intensity distributions 54a–54e as drawn at the right side of the illuminated plane 40.

However, the incident light blurred at the light incidence plane of a fly-eye lens would increase the Helmholtz-Lagrange invariant, thus causing a light amount loss. The Helmholtz-Lagrange invariant is an angle formed between a height from an optical axis and the optical axis, and does not decrease in an optical system by what is called the Helmholtz-Lagrange formula in optics. The illumination apparatus fixes the size of the illuminated plane and the maximum angle of light incident upon the illuminated plane, and thus fixes the Helmholtz-Lagrange invariant on the illuminated plane. The distribution blurred at the light incidence plane of the fly-eye lens would increase the height from the optical axis without changing the angle formed with the optical axis, thus resulting in increasing the Helmholtz-Lagrange invariant. As mentioned above, the Helmholtz-Lagrange invariant does not decrease in an optical system; it does not change and it merely increases. Thus, the light exceeding the Helmholtz-Lagrange invariant at the illuminated area cannot reach the illuminated plane, causing blur in the optical system and a loss of the light amount. In other words, blur may be effective means for providing the uniform light intensity distribution. Nevertheless, it causes a loss of a large light amount, and thus cannot be used frequently.

This embodiment provides the high light utilization, uniform effective light source distribution, and uniform illuminance on the illuminated plane since there is no blurred light intensity distribution at the light incidence plane 152 of the fly-eye lens 150, and there is no shield by a stop.

A cylindrical lens may be used in place of a fly-eye lens in this embodiment (as a variation). Here, a cylindrical lens used instead of a fly-eye lens may combine multiple cylindrical lenses such that their mutual buses are orthogonal to each other, and structurally provide effects similar to the fly-eye lens, whereby the fly-eye lenses 130, 150, and 170 in FIG. 6 or 7 of this embodiment are replaced with this combination of cylindrical lenses. At that time, these cylindrical lenses may be combined as shown in FIG. 21, or multiple cylindrical lenses whose mutual buses are orthogonal to each other may be combined in a manner different from FIG. 21. Here, when multiple cylindrical lenses combined are viewed from the optical axis direction, the combination of these cylindrical lenses looks like a lattice as shown in FIG. 21B. Here, each compartment that seems to be partitioned is called a light splitting area. This light splitting area 210 serves as a rod lens of a fly-eye lens.

Multiple sides as an outline of this light splitting area 210 are made non-parallel between two combinations of cylindrical lenses arranged in place of the fly-eye lenses 130 and 150 in FIG. 6, and also made non-parallel between two combinations of cylindrical lenses arranged in place of the fly-eye lenses 150 and 170 in FIG. 6. Furthermore, an angle of 22.5° is formed between the sides as outlines of mutual light splitting areas between two combinations of cylindrical lenses arranged in place of the fly-eye lenses 130 and 150 in FIG. 6, and an angle of 22.5° is formed between the sides as outlines of mutual light splitting areas between two combinations of cylindrical lenses arranged in place of the fly-eye lenses 150 and 170 in FIG. 6. A cylindrical lens includes the parallel or alternatively non-parallel sides of the lattice between two combinations of cylindrical lenses arranged in place of the fly-eye lenses 130 and 170 in FIG. 6.

The combination of cylindrical lenses arranged in place of the fly-eye lens 150 includes the light splitting areas unsymmetrical to the symmetry axes of light splitting areas in a combination of cylindrical lenses arranged in place of the fly-eye lens 130, and a straight line parallel to them. The combination of cylindrical lenses arranged in place of the fly-eye lens 170 includes the light splitting areas unsymmetrical to the symmetry axes of the light splitting areas included in the combination of cylindrical lenses arranged in place of the fly-eye lens 150 and a straight line parallel to them. However, a combination of cylindrical lenses arranged in place of the fly-eye lens 170 includes the light splitting areas preferably symmetrical but alternatively unsymmetrical to symmetry axes of light splitting areas included in the combination of cylindrical lenses arranged for in place of the fly-eye lens 130, and a straight line parallel to them.

Figure 11:
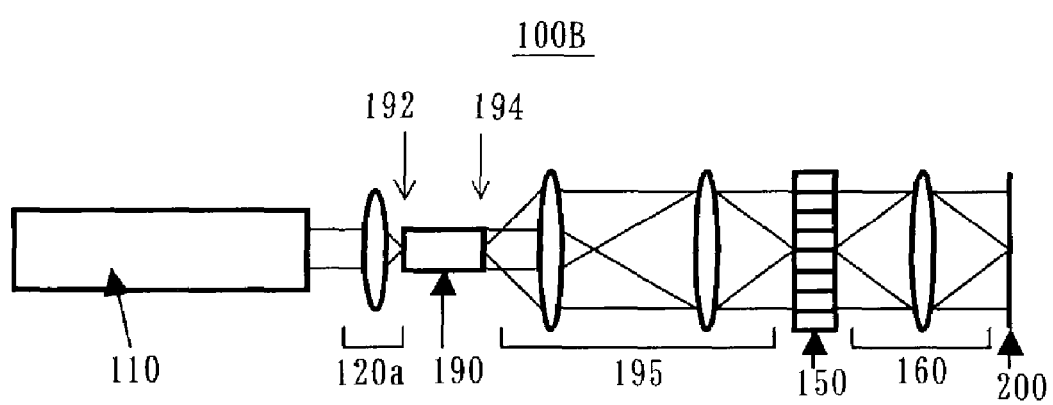
FIG. 11 shows a simplified optical path in another variation of the illumination apparatus shown in FIG. 1.

A description will now be given of still another variation of the illumination apparatus 100 with referring to FIG. 11. Here, FIG. 11 is a schematic view showing a simplified optical path of an illumination apparatus 100B as a variation of the illumination apparatus 100. The illumination apparatus 100B uses an optical pipe (or an internal reflection member) 190 as a light integrator, and includes a condensing optical system 120a and a relay optical system 195.

The condensing optical system 120a condenses light from the light source 110 near the light incidence plane of the optical pipe 190, creating light with a specific divergent angle, which enters the optical pipe 190. The condensing optical system 120a includes at least one lens element, but may include a mirror for deflecting a light path if necessary. If the optical pipe includes a glass rod, the condensed point by the condensing optical system 120a is defocused on the light source side from the optical pipe 190's light incidence plane 192 to improve the durability of the glass rod.

The optical pipe 190 makes an uneven light intensity distribution at the light incidence plane even at the light exit plane, while allowing light entering from the condensed point by the condensing optical system 120a with a specific divergent angle to continue to reflect on the internal sides. The optical pipe 190's light incidence plane 192 is arranged at a short distance from the condensed point. This is because the enormous energy density around the focal point could damage the coatings (or anti-reflection films) and glass material at the optical pipe 190's light incidence plane.

This embodiment makes the optical pipe 190 of a reflection plane with a hexagonal section and, for example, a hexagonal column rod made of glass. However, this structure is exemplary, and the section may be m-gonal (m=even number) or a hollow rod. The light incidence plane 192 of the optical pipe 190 and the light incidence plane 152 of the fly-eye lens 150 are arranged optically conjugate, and the shape of the optical pipe 190 is, for example, a rectangle, and is arranged relative to the fly-eye lens 150 as shown in FIG. 2.

The relay optical system 195 images the light exit plane 194 of the optical pipe 190 onto the light incidence plane 152 of the fly-eye lens 150 under a specific magnification, and both are in an approximately conjugate relationship. The relay optical system 195 includes a magnification-variable zoom lens, and may adjust the area of a beam incident upon the fly-eye lens 150. Therefore, it may create multiple illumination conditions (i.e., coherence factor σ: NA of illumination optical system/NA of projection optical system).

Other structures are the same as those of the illumination apparatus 100, and a detailed description thereof will be omitted. Such an illumination apparatus 100B can perform an operation similar to that of the illumination apparatus 100.

The illumination apparatus 100B is greatly affected by the transmittance of glass, since the optical pipe 190 requires a long optical rod for the uniform effective light source distribution. Therefore, it is preferable to use the illumination apparatus 100 or 100A having good transmittance with a light source with a short wavelength (e.g., an $F_2$ excimer laser with a wavelength of 157 nm).

The mask 200 is made, for example, of quartz, which forms a circuit pattern (or an image) to be transferred, and is supported and driven by a mask stage (not shown). Diffracted light emitted from the mask 200 passes through the projection optical system 300, and then is projected onto the plate 400. The plate 400 is an object to be exposed, onto which resist is applied. The mask 200 and the plate 400 are located in an optically conjugate relationship.

If the exposure apparatus 1 is a step-and-scan exposure apparatus (namely, a scanner), a pattern on the mask 200 is transferred onto the plate 400 by scanning the mask 200 and the plate 400. If it is a step-and-repeat exposure apparatus (i.e., "a stepper"), the mask 200 and the plate 400 are kept stationary for exposure.

The mask stage (not shown) supports the mask 200, and is connected to a transport mechanism (not shown). The mask stage and projection optical system 300 are installed on a stage/lens barrel stool supported via a damper, for example, to the base-frame placed on the floor. The mask stage may use any structure known in the art. The transport mechanism (not shown) includes a linear motor and the like, and drives the mask stage in a direction orthogonal to the optical axis, thus moving the mask 200. The exposure apparatus 1 scans the mask 200 and plate 400 in a state synchronized by a controller (not shown).

The projection optical system 300 forms an image onto the plate 400 from diffracted beams that have passed through the pattern formed on the mask 200. The projection optical system 300 may use an optical system solely including a plurality of lens elements, an optical system including a plurality of lens elements and at least one concave mirror (a catadioptric optical system), an optical system including a plurality of lens elements and at least one diffractive optical element such as a kinoform, a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit.

The plate 400 is a wafer in this embodiment, but it may include a liquid crystal plate and a wide range of other objects to be exposed. Photoresist is applied onto the plate 400. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photo resist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate 400 is supported by a wafer stage (not shown). The wafer stage may use any structure known in the art, and thus a detailed description thereof will be omitted. For example, the wafer stage uses a linear motor to move the plate 400 in a direction orthogonal to the optical axis. The mask 200 and the plate 400 are, for example, scanned synchronously, and the positions of the mask stage and wafer stage are monitored, for example, by a laser interferometer and the like, so that both are driven at a constant speed ratio. The wafer stage is installed on a stage stool supported on the floor and the like, for example, via a damper.

A description will now be given of the operation of the exposure apparatus 1. In exposure, light emitted from the light source 110 is reshaped into a desired beam shape by the beam shaping optical system 120, and then enters the fly-eye lens 130. The fly-eye lens 130 uniformly illuminates the fly-eye lens 150 via the condenser lens 140. The beam having passed the fly-eye lens 150 illuminates the mask 200 plane via the condenser lens 160. The positional relationship between the fly-eye lenses 130 and 150 may provide the uniform effective light source shape.

In adjusting the positional relationship between the fly-eye lenses 130 and 150, either one may be rotated. However, for example, in the configuration shown in FIG. 6, the sectional shape of the rod lens 156 in the fly-eye lens 150 is usually set to be a hexagon, and when producing a circle from a hexagon, the rotation does not affect. Thus, it is desirable to rotate the fly-eye lens 150.

The beam having passed the mask 200 is demagnified and projected under a specific magnification onto the plate 400 by the imaging operations of the projection optical system 300. The angular distribution of the exposure beam on the plate 400 (i.e., the effective light source distribution) becomes practically uniform. If the exposure apparatus 1 is a stepper, it will fix the light source part and the projection optical system 300, and synchronously scan the mask 200 and plate 400, then exposing the entire shot. The wafer stage of the plate 400 is stepped to the next shot, thus exposing and transferring a large number of shots on the plate 400. If the exposure apparatus 1 is a scanner, exposure would be performed with the mask 200 and the plate 400 in a stationary state.

The exposure apparatus 1 of the present invention provides the uniform effective light source distribution by setting the sides of the rod lenses of the fly-eye lens 130 or the light intensity distributions created by the fly-eye lens 130 to be non-parallel to any side of the rod lens 156 or unsymmetrical to the symmetry axis of the rod lens 156. Thus, it may perform a pattern transfer to the resist with high resolution and provide high quality devices (such as semiconductor devices, LCD devices, image pick-up devices (such as CCD, etc.), thin-film magnetic heads, and the like). Since a stop and the like are not arranged near the light incidence plane of the fly-eye lens 150, it is possible to prevent a light amount to be lost and throughput to be lowered.

Figure 8:
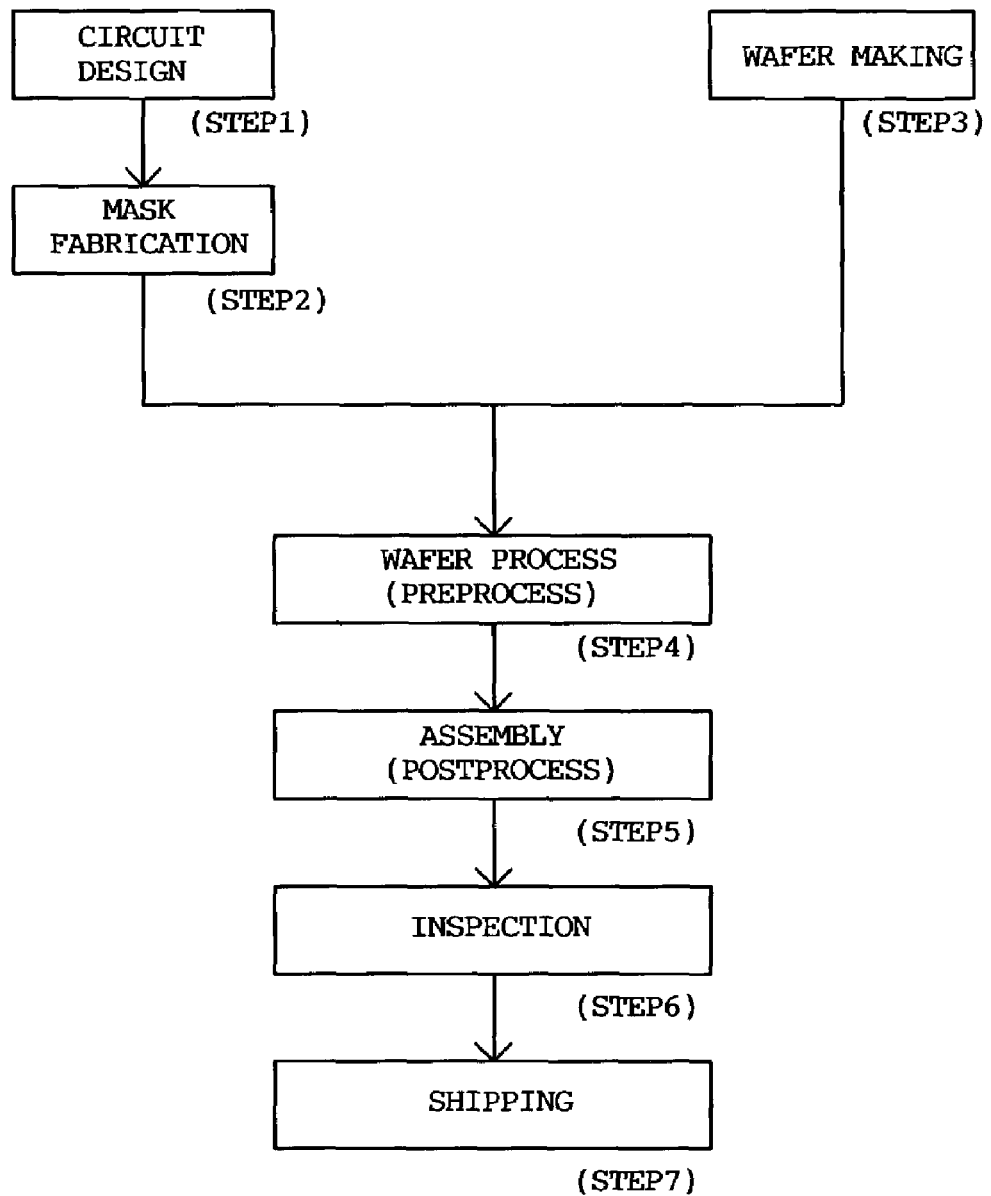
FIG. 8 is a flowchart for explaining how to fabricate devices (such as semiconductor chips such as ICs, LSIs and the like, LCDs, CCD and the like).
Figure 9:
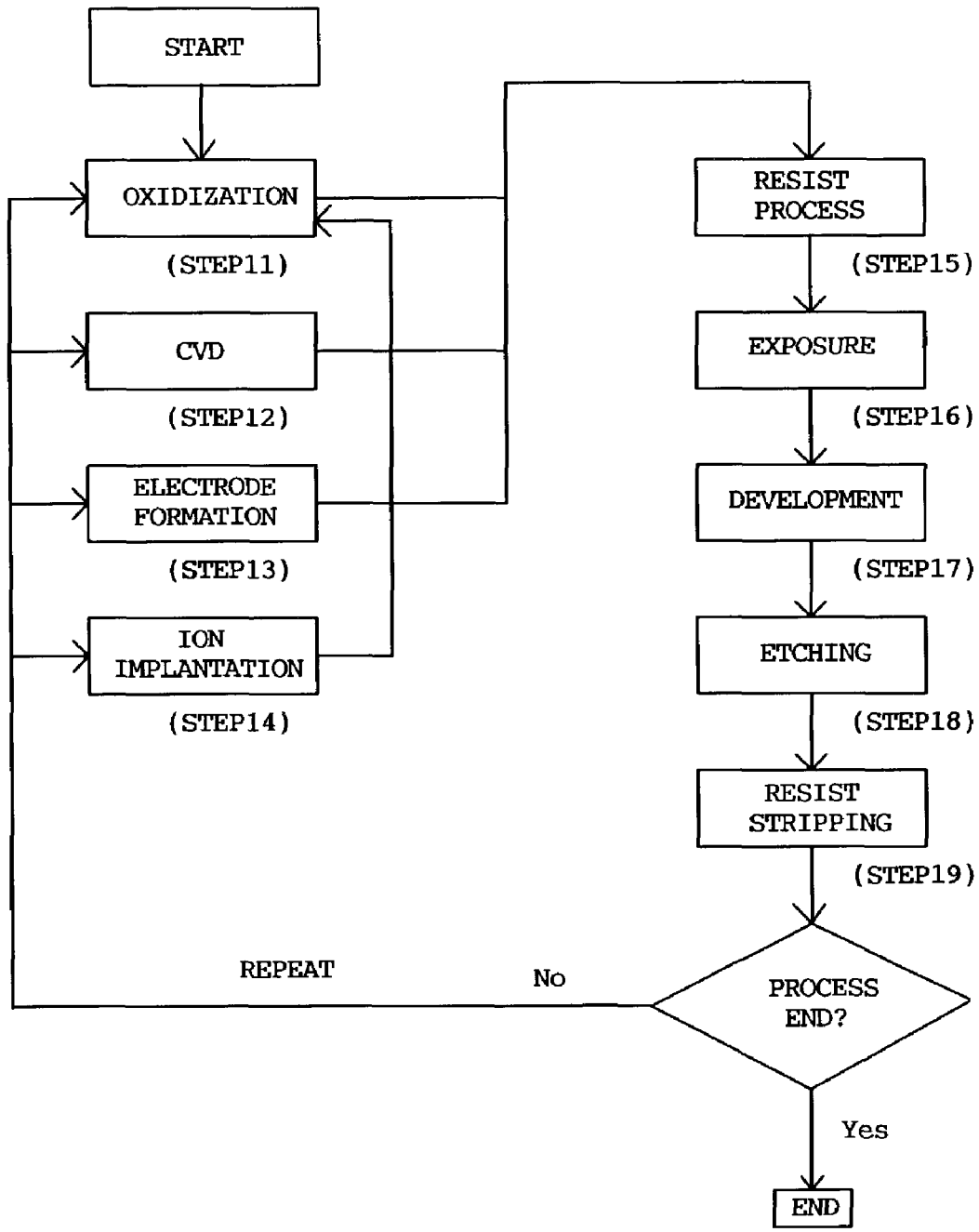
FIG. 9 is a detailed flowchart for Step 4 (wafer process) shown in FIG. 8.

Referring now to FIGS. 8 and 9, a description will now be given of an embodiment of a device fabricating method using the above-described exposure apparatus 1. FIG. 8 is a flowchart for explaining how to fabricate devices (i.e., semiconductor chips such as IC and LSI, LCDs, CCD). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography of the present invention using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 9 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer.

Step 16 (exposure) uses the exposure apparatus 1 to expose a circuit pattern on the mask onto the wafer. Step 17 (development) develops the exposed wafer. Step 18 (etching) etches parts other than a developed resist image. Step 19 (resist stripping) removes disused resist after etching.

These steps are repeated, and multi-layer circuit patterns are formed on a wafer. By using the device fabricating method of this embodiment, it is possible to uniformalize effective light source distributions, thus fabricating devices with higher quality than conventionally as well as preventing throughput from being lowered by a stop and eliminating blur. This is also excellent economically. In this manner, the device fabricating method that uses such an exposure apparatus 1 and the device as a final product serve as other aspects according to the present invention.

Further, the present invention is not limited to these preferred embodiments and various variations and modifications may be made without departing from the spirit and scope of the present invention.

According to the present embodiments, it is possible to obtain an approximately uniform distribution on the illuminated plane with no stop at a light incidence plane of a rod lens and without blurring a distribution at the light incidence plane of the rod lens, thus embodying an illumination apparatus with few losses of a light amount. Use of such an illumination apparatus enables an implementation of a highly productive exposure apparatus.

The illumination apparatus of this invention, the exposure apparatus including the illumination apparatus, and the device fabricating method not only improve a light intensity distribution at an illuminated plane, but also prevent a light amount being lost and throughput being lowered.

What is claimed is:

1. An illumination optical system comprising:
   a first optical system for illuminating a plurality of condensing systems of a third light integrator with light from a light source; and
   a second optical system for illuminating an illuminated plane with light from the plurality of condensing systems of the third light integrator,
   wherein said first optical system includes a first light integrator having a plurality of condensing systems and a first condenser lens that forms a Fourier transformation relationship between a light exit plane of the first light integrator and a light incidence plane of the third light integrator; and
   wherein said second optical system includes a second light integrator having a plurality of condensing systems and a second condenser lens that forms a Fourier transformation relationship between a light exit plane of the third light integrator and a light incidence plane of the second light integrator, and
   wherein each side on an outline of a light incidence plane of each condensing system of the third light integrator is not parallel to any one of sides that form an outline of a light incidence plane of condensing systems of the first light integrator, and
   wherein each side on the outline of the light incidence plane of each condensing system of the third light integrator is not parallel to any one of sides that form an outline of a light incidence plane of each condensing system of the second light integrator.

2. An illumination optical system according to claim 1, wherein a light incident plane of one of said plurality of condensing systems of the third optical integrator and a light incident plane of one of said plurality of condensing systems of the first optical integrator are both rectangles, and
   wherein angles between a plurality of sides on the outline of the light incidence plane of each condensing system in the third optical integrator and a plurality of sides on outlines of the light incidence planes of the plurality of condensing systems in the first optical integrator are 18° to 30°.

3. An illumination optical system according to claim 2, wherein the angles are approximately 22.5°.

4. An illumination optical system according to claim 1, wherein a light incident plane of one of said plurality of condensing systems of the third optical integrator and a light incident plane of one of said plurality of condensing systems of the first optical integrator are a rectangle and a hexagon or both hexagons, and
   wherein angles between a plurality of sides on the outline of the light incidence plane of each condensing system in the third optical integrator and a plurality of sides on outlines of the light incidence planes of the plurality of condensing systems in the first optical integrator are 12° to 20°.

5. An illumination optical system according to claim 4, wherein the angles are approximately 15°.

6. An illumination optical system according to claim 1, wherein at least one of a plurality of sides on an outline of a light incidence plane of each condensing system in said first light integrator are approximately parallel to at least one of sides that form an outline of a light incidence plane of each condensing system of said second light integrator.

7. An illumination optical system according to claim 1, wherein a light incidence plane of each condensing system of the first light integrator and a light incidence plane of the third light integrator are optically conjugate to each other.

8. An illumination optical system according to claim 1, wherein light incidence planes of the third light integrator and second light integrator are optically disconjugate to each other.

9. An illumination optical system according to claim 1, wherein a light incidence plane of each condensing system in the second light integrator and the illuminated plane are optically conjugate to each other.

10. An illumination optical system according to claim 1, wherein a plurality of beams from some of plurality of condensing systems of the third light integrator each illuminate the whole illuminated plane, wherein a plurality of beams from the remaining condensing systems each illuminate only parts of the illuminated planes, and have different illumination ranges to each other.

11. An illumination optical system according to claim 1, wherein each side on an outline of an illumination range in which light from said first light integrator illuminates the illuminated plane of said third light integrator is not parallel to any one of a plurality of sides of an outline of a light incidence plane of each condensing system.

12. An illumination optical system according to claim 1, wherein the plurality of condensing systems in the third light integrator, the first and second light integrators include a rod lens with convex spherical surfaces at light incidence and exit planes.

13. An illumination optical system according to claim 1, wherein the plurality of condensing systems in the third light integrator, the first and second light integrators include a cylindrical lens array formed by staking a pair of convex cylindrical lenses having the same first bus direction and a pair of concave cylindrical lenses having the same second bus direction orthogonal to the first bus direction.

14. An exposure apparatus comprising:

an illumination optical system illuminating a reticle or a mask with light from a light source, said illumination optical system comprising a first optical system for illuminating a plurality of condensing systems of a third light integrator with light from a light source; and a second optical system for illuminating the reticle or the mask with light from the plurality of condensing systems of the third light integrator, wherein said first optical system includes a first light integrator having a plurality of condensing systems and a first condenser lens that forms a Fourier transformation relationship between a light exit plane of the first light integrator and a light incidence plane of the third light integrator; and wherein said second optical system includes a second light integrator having a plurality of condensing system and a second condenser lens that forms a Fourier transformation relationship between a light exit plane of the third light integrator and a light incidence plane of the second light integrator, and wherein each side on an outline of a light incidence plane of each condensing system of the third light integrator is not parallel to any one of the sides that form an outline of a light incidence plane of condensing systems of the first light integrator, and wherein each side of the outline of the light incidence plane of each condensing system of the third light integrator is not parallel to any one of the sides that form an outline of a light incidence plane of each condensing system of the second light integrator; and a projection optical system for projecting an image of a pattern of the reticle or the mask onto an exposed plate.

* * * * *